(12) United States Patent
Shen et al.

(10) Patent No.: US 11,670,573 B2
(45) Date of Patent: Jun. 6, 2023

(54) LOW-STRESS PASSIVATION LAYER

(71) Applicant: Taiwan Semiconductor Manufacturing Co., Ltd., Hsinchu (TW)

(72) Inventors: Hsiang-Ku Shen, Hsinchu (TW); Chun-Li Lin, Hsinchu (TW); Dian-Hau Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 57 days.

(21) Appl. No.: 17/337,965

(22) Filed: Jun. 3, 2021

(65) Prior Publication Data

US 2021/0287973 A1   Sep. 16, 2021

Related U.S. Application Data

(62) Division of application No. 16/656,617, filed on Oct. 18, 2019, now Pat. No. 11,031,325.

(51) Int. Cl.
| | |
|---|---|
| *H01L 23/495* | (2006.01) |
| *H01L 23/498* | (2006.01) |
| *H01L 23/532* | (2006.01) |
| *H01L 21/48* | (2006.01) |
| *H01L 21/02* | (2006.01) |

(52) U.S. Cl.
CPC ........... *H01L 23/49811* (2013.01); *H01L 21/02274* (2013.01); *H01L 21/486* (2013.01); *H01L 23/53219* (2013.01); *H01L 23/53233* (2013.01); *H01L 23/53295* (2013.01)

(58) Field of Classification Search
CPC ......... H01L 23/49811; H01L 23/53295; H01L 23/5384; H01L 2224/0233
USPC ........................................ 257/783, 786, 774
See application file for complete search history.

(56) References Cited

U.S. PATENT DOCUMENTS

| | | | |
|---|---|---|---|
| 4,761,386 A | 8/1988 | Buynoski | |
| 6,175,161 B1 | 1/2001 | Goetz | |
| 6,181,569 B1 | 1/2001 | Chakravorty | |
| 7,528,480 B2 | 5/2009 | Mihara | |
| 7,964,973 B2* | 6/2011 | Lin | H01L 23/53252 257/781 |
| 8,022,544 B2* | 9/2011 | Lin | H01L 24/13 257/E23.021 |
| 8,242,601 B2* | 8/2012 | Chou | H01L 21/76801 257/737 |

(Continued)

*Primary Examiner* — Nitin Parekh
(74) *Attorney, Agent, or Firm* — Haynes and Boone, LLP

(57) ABSTRACT

Semiconductor devices and methods of forming the same are provided. In one embodiment, a semiconductor device includes a redistribution layer including a first conductive feature and a second conductive feature, a first contact feature disposed over and electrically coupled to the first conductive feature, a second contact feature disposed over and electrically coupled to the second conductive feature, and a passivation feature extending from between the first conductive feature and the second conductive feature between the first contact feature and the second contact feature. The passivation feature includes a dielectric feature and a dielectric layer. The dielectric layer is disposed on a planar top surface of the dielectric feature and a composition of the dielectric feature is different from a composition of the dielectric layer.

20 Claims, 11 Drawing Sheets

(56) References Cited

U.S. PATENT DOCUMENTS

| | | | |
|---|---|---|---|
| 8,581,404 B2* | 11/2013 | Chou | H01L 24/11 |
| | | | 257/E23.153 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,796,582 B1 | 10/2017 | Cheng | |
| 11,244,919 B2* | 2/2022 | Hsiao | H01L 24/13 |
| 2006/0060961 A1* | 3/2006 | Lin | H01L 23/3114 |
| | | | 257/737 |
| 2007/0205520 A1 | 9/2007 | Chou | |
| 2008/0146018 A1* | 6/2008 | Lin | H01L 24/13 |
| | | | 438/618 |
| 2009/0057894 A1* | 3/2009 | Chou | H01L 23/53252 |
| | | | 257/737 |
| 2009/0108453 A1* | 4/2009 | Lin | H01L 24/11 |
| | | | 257/E23.145 |
| 2011/0121445 A1 | 5/2011 | Mori | |
| 2011/0254165 A1 | 10/2011 | Muranaka | |
| 2011/0291272 A1* | 12/2011 | Lin | H01L 23/525 |
| | | | 257/737 |
| 2012/0038043 A1 | 2/2012 | Jin | |
| 2013/0249080 A1 | 9/2013 | Lin | |
| 2017/0053882 A1 | 2/2017 | Jin | |
| 2018/0026023 A1 | 1/2018 | Lin | |

* cited by examiner

LOW-STRESS PASSIVATION LAYER

PRIORITY DATA

This is a divisional application of U.S. patent application Ser. No. 16/656,617, entitled "Low-Stress Passivation Layer," filed Oct. 18, 2019, which is incorporated by reference in its entirety

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

For example, ICs are formed on a semiconductor substrate that may be cut into individual device dies or IC chips. Each IC chip may be further attached (such as by bonding) to an interposer, a reconstituted wafer, a circuit board, or another die to form a package or a device. To meet various routing needs, a redistribution layer (RDL) of conductive metal lines may be formed on an IC chip to reroute bond connections from the edge to the center of the chip, or generally to disperse bond connections to an area greater than that of the IC chip. One or more passivation layers have been implemented around the RDL to protect the semiconductor surface from electrical shorts, stress, and chemical contaminants. However, some passivation layers are prone to stress and cracks during subsequent anneal processes and may lead to voids or cracks between adjacent metal contacts. Therefore, although existing passivation layers and the fabrication thereof have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1:
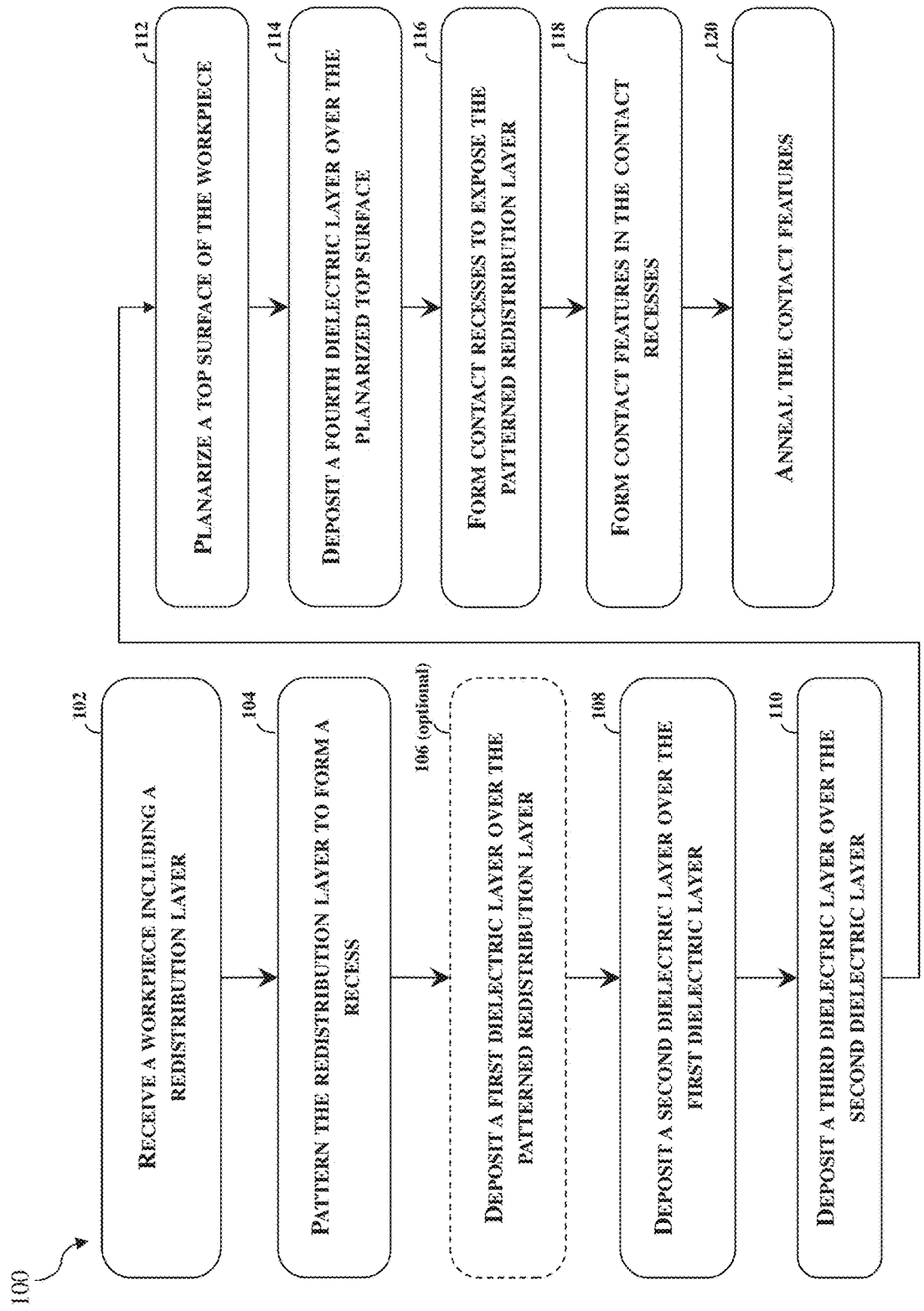
FIG. 1 is a flow chart of a method for fabricating a semiconductor device in accordance with embodiments of the present disclosure.

It is understood that the following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

On many IC chips, a redistribution layer (RDL) of conductive metal lines is formed to reroute bond connections from the edge to the center of the chip or generally to distribute bond connections to an area larger than that of the IC chip. One or more passivation layers may be formed the RDL to protect the semiconductor surface from electrical shorts, mechanical stresses and chemical contaminants. In some instances, a polymeric protection layer is formed over the one or more passivation layers, which are formed of different semiconductor-based dielectric layers. Due to volumetric shrinkage of the polymeric protection layer as a result of curing and mismatch of coefficient of thermal expansion (CTE) between the polymeric protection layer and the one or more passivation layer, stress may be exerted on the one or more passivation layer. It has been observed that stress may be concentrated at locations where the one or more passivation layer is not planar, such as corners near an interface between two different dielectric material layers. For example, after an RDL layer is formed over an IC workpiece and patterned, one or more recesses may be formed among conductive features of the RDL. In some conventional technology, a plurality of silicon oxide layers may be deposited over the IC workpiece. As the plurality of silicon oxide layers still does not fill the recesses, the top surface of the plurality of silicon oxide layers is not planar and may include dents or lower regions. When a top dielectric layer is deposited over the plurality silicon oxide layers, that top dielectric layer may include corners as a portion of the top dielectric layer extends into the dents or lower regions. Concentrated stress at those corners may propagate through the one or more passivation layers to reach the RDL, causing leakage and failures.

The present disclosure provides a semiconductor device with a multi-layer passivation structure and methods of making the same to address these issues. In some embodiments, a semiconductor device includes a passivation structure that has a plurality of oxide layers and a planar nitride layer over the plurality of oxide layers. After the last oxide layer of the plurality of oxide layers is deposited, a planarization process, such as a chemical mechanical polishing (CMP) process is performed to provide a level top surface free of any recesses, dents, and lower regions. The planar nitride layer is then deposited on the level top surface. As a result, no portion of the planar nitride layer extends into any portion of the plurality of oxide layers. The planar nitride layer includes no corners or corner structures where thermal cracks may develop, thus reducing defect occurrence and improving process yield.

The various aspects of the present disclosure will now be described in more detail with reference to the figures. In that regard, FIG. 1 is a flowchart illustrating a method 100 for fabricating a semiconductor device according to embodiments of the present disclosure. The method 100 is merely an example and is not intended to limit the present disclosure to what is explicitly illustrated in the method 100. Additional steps can be provided before, during, and after the method 100, and some steps described can be replaced, eliminated, or moved around for additional embodiments of the method. Not all steps are described herein in detail for reasons of simplicity. The method 100 is described below in conjunction with FIGS. 2-11, which are diagrammatic fragmentary cross-sectional views of a workpiece 200 at different stages of fabrication according to embodiments of the present disclosure. As the workpiece 200 is to become or include a semiconductor device, workpiece 200 may be referred to semiconductor device 200 from time to time for simplicity.

Figure 2:
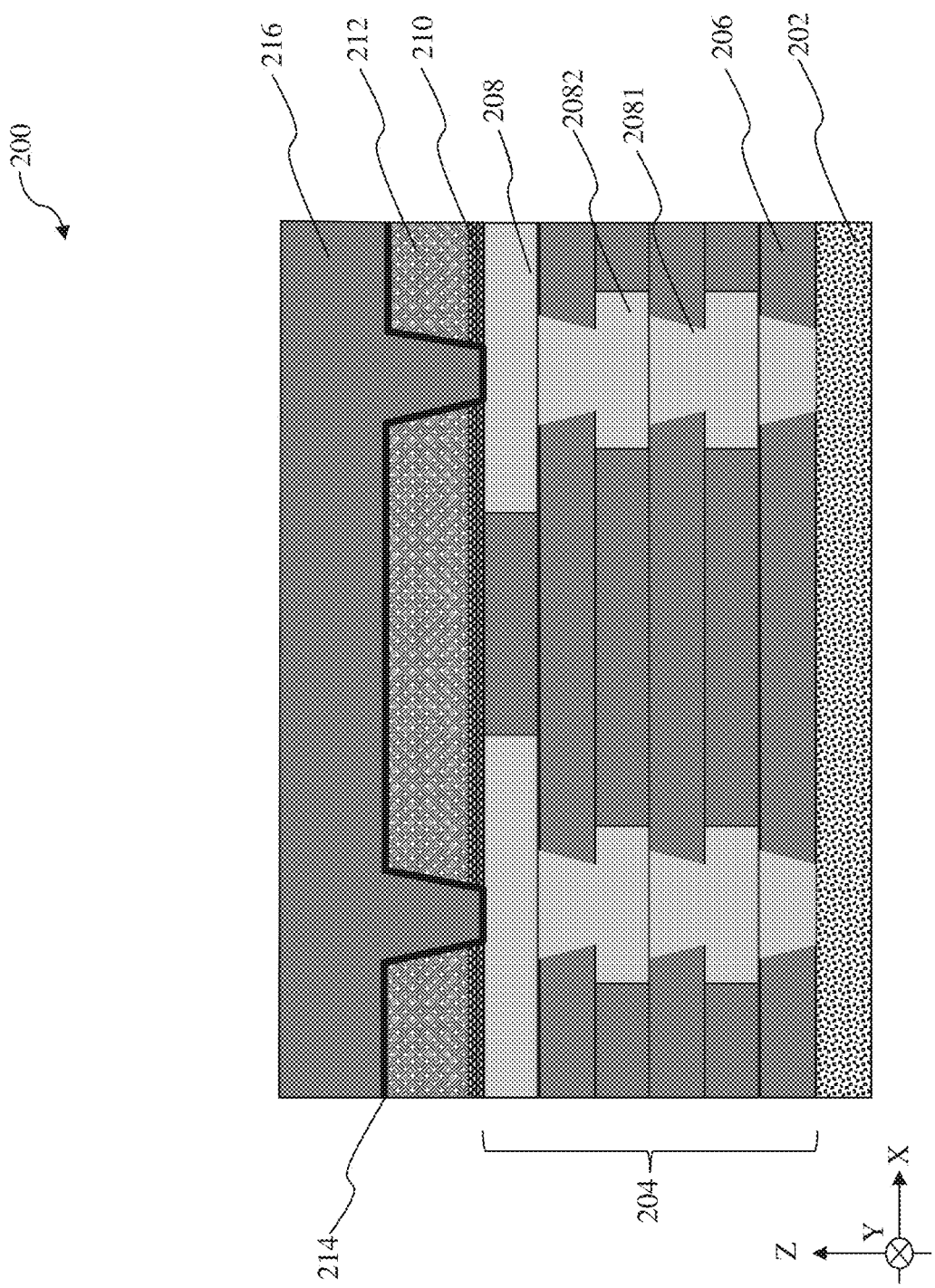
FIGS. 2-11 are cross-sectional views of a workpiece at various stages of fabrication according to embodiments of the present disclosure.

Referring to FIGS. 1 and 2, the method 100 includes a block 102 where a workpiece 200 that includes a redistribution layer (RDL) 216 is received. In embodiments represented in FIG. 2, the workpiece 200 includes a substrate 202, an interconnect structure 204 over the substrate 202, an etch stop layer 210 over the interconnect structure 204, a first passivation layer 212, a barrier layer 214, and the RDL 216 over and electrically coupled to the interconnect structure 204. In some embodiments, substrate 202 may be made of silicon or other semiconductor materials such as germanium. In some other embodiments, substrate 202 may include a compound semiconductor such as silicon carbide, gallium arsenic, indium arsenide, or indium phosphide. In still other embodiments, substrate 202 may include an alloy semiconductor such as silicon germanium, silicon germanium carbide, gallium arsenic phosphide, or gallium indium phosphide. In some alternative embodiments, substrate 202 may include an epitaxial layer overlying a bulk semiconductor. Various microelectronic components may be formed in or on the substrate 202, such as transistor components including source/drain features and/or gate structures, isolation structures including shallow trench isolation (STI), passive components, or any other suitable components.

The interconnect structure 204 may be a multi-layered interconnect (MLI) structure, which is formed over the substrate 202 and may include contact vias 2081, conductive lines 2082 embedded into multiple inter-metal dielectric (IMD) layers 206 to provide interconnections (e.g., wiring) between the various microelectronic components that have been or will be formed on the workpiece 200. There may be intermediate layers or components disposed between the interconnect structure 204 and the substrate 202, but in the interest of simplicity such layers or components are not shown. The IMD layers 206 may include silicon oxide or low-k dielectric materials whose k-values (dielectric constants) are smaller than that of silicon dioxide, which is about 4. In some embodiments, the low-k dielectric materials include a porous organosilicate thin film such as SiOCH, tetraethylorthosilicate (TEOS) oxide, un-doped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOCN), hydrogen silsesquioxane (HSQ), methylsilsesquioxane (MSQ), or combinations thereof.

Contact vias 2081 and conductive lines 2082 are formed in the IMD layers 206. The formation process for the contact vias 2081 and conductive lines 2082 may include single damascene and/or dual damascene processes. In a single damascene process, a trench is first formed in one of the IMD layers 206, followed by filling the trench with a conductive material. A planarization such as a Chemical Mechanical Polish (CMP) process is then performed to remove the excess portions of the conductive material higher than the top surface of the IMD layer, leaving a metal line in the trench. In a dual damascene process, both a trench and a via opening are formed in an IMD layer, with the via opening underlying and connected to the trench. The conductive material is then filled into the trench and the via opening to form a metal line and a via, respectively. The conductive material may include a diffusion barrier layer and a copper-containing metallic material over the diffusion barrier layer. The diffusion barrier layer may include titanium, titanium nitride, tantalum, tantalum nitride, tungsten, cobalt, cobalt nitride, tungsten nitride, ruthenium, ruthenium nitride, other metal, or other metal nitride. The copper-containing metallic material may include copper, cupronickel, a copper-aluminum alloy. Conductive lines 2081 at the same level may be collectively referred to as a metal layer and different metal layers are interconnected by one or more contact vias 2082. In implementations illustrated in FIG. 2, the workpiece 200 includes a top metal layer 208, which serves as an interface with the RDL 216.

The workpiece 200 also includes the etch stop layer 210 and the first passivation layer 212 that are formed ahead of the formation of the RDL 216. In an embodiment, the etch stop layer 210 may include silicon carbon nitride (SiCN), silicon oxycarbide (SiOCN), silicon oxycarbide (SiOC), silicon carbide (SiC), or silicon nitride (SiN), or combinations thereof. The first passivation layer 212 is formed over the etch stop layer 210. The first passivation layer 212 may be a single layer or a composite layer, and may be formed of a non-porous material. In some instances, the first passivation layer 212 may be a single layer including silicon oxide.

The RDL 216 is electrically coupled to the interconnect structure 204 by way of openings through the etch stop layer 210 and the first passivation layer 212. In some embodiments, after the openings are formed, the barrier layer 214 is deposited over the workpiece 200 to insulate the to-be-formed RDL 216 from the first passivation layer 212. The barrier layer 214 serves as a diffusion barrier to block copper or aluminum diffusion into the first passivation layer 212 as well as to oxygen diffusion into the RDL 216 as a result of subsequent annealing processes. The barrier layer 214 may include titanium, titanium nitride, tantalum, tantalum nitride, tungsten, cobalt, cobalt nitride, tungsten nitride, ruthenium, ruthenium nitride, other metal, or other metal nitride. Although not separately shown, a blanket copper seed layer may also be formed over the barrier layer 214 such that the RDL 216 may be formed using electroplating. The RDL 216 may be formed of copper or an aluminum-copper alloy. In some embodiments represented in FIG. 2, the RDL 216 is formed of an aluminum-copper alloy.

Figure 3:
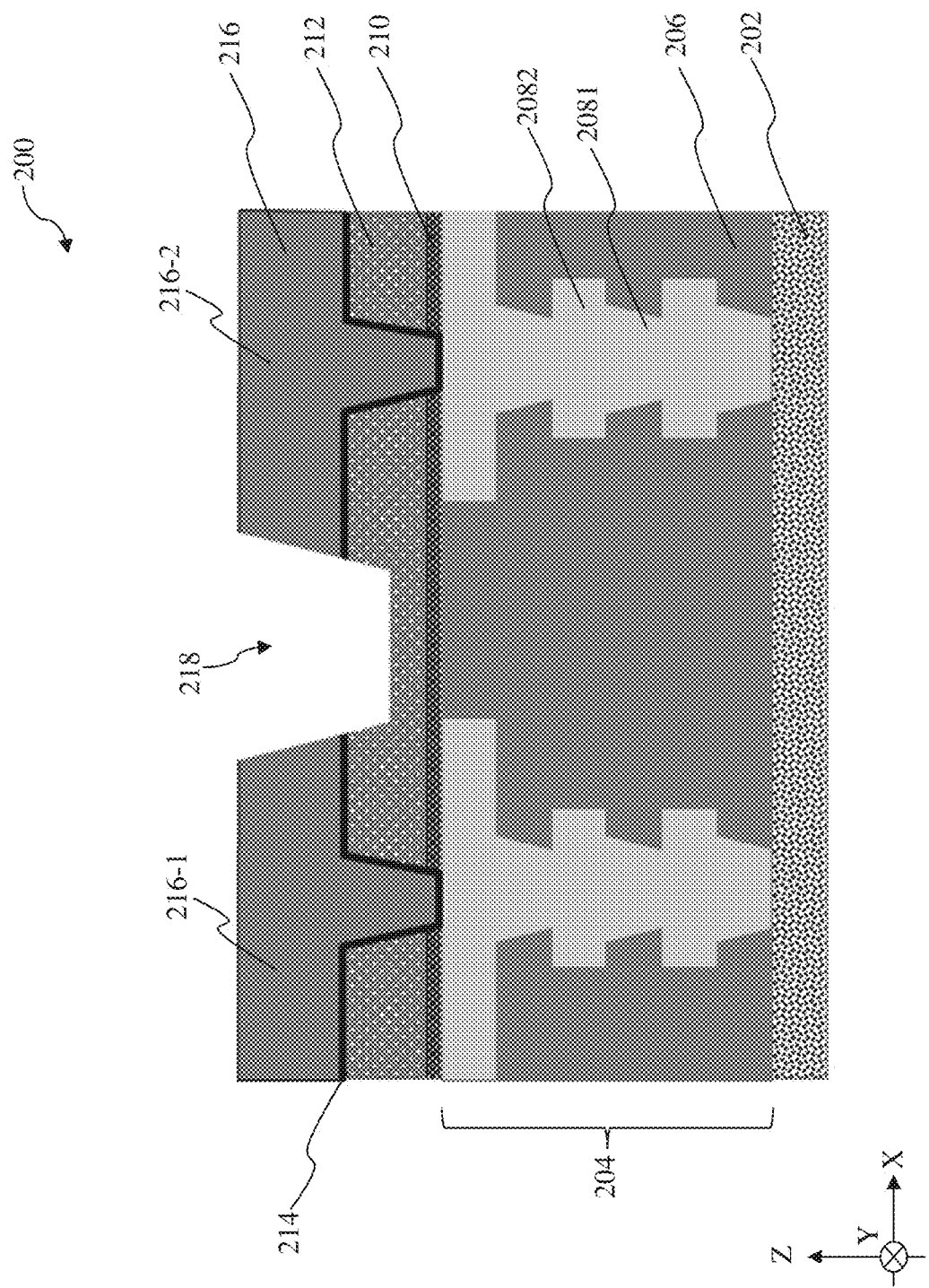

Referring now to FIGS. 1 and 3, the method 100 includes a block 104 where the RDL 216 is patterned to form a recess 218. The recess 218 extends through the RDL 216 to electrically separate the RDL 216 into a first conductive feature 216-1 and a second conductive feature 216-2 along the cross-section shown in FIG. 3. Each of the first conductive feature 216-1 and the second conductive feature 216-2 may extend along the Y direction. In some implementations shown in FIG. 3, the recess 218 not only extends through the RDL 216, but also the barrier layer 214, into the first passivation layer 212.

Figure 4:
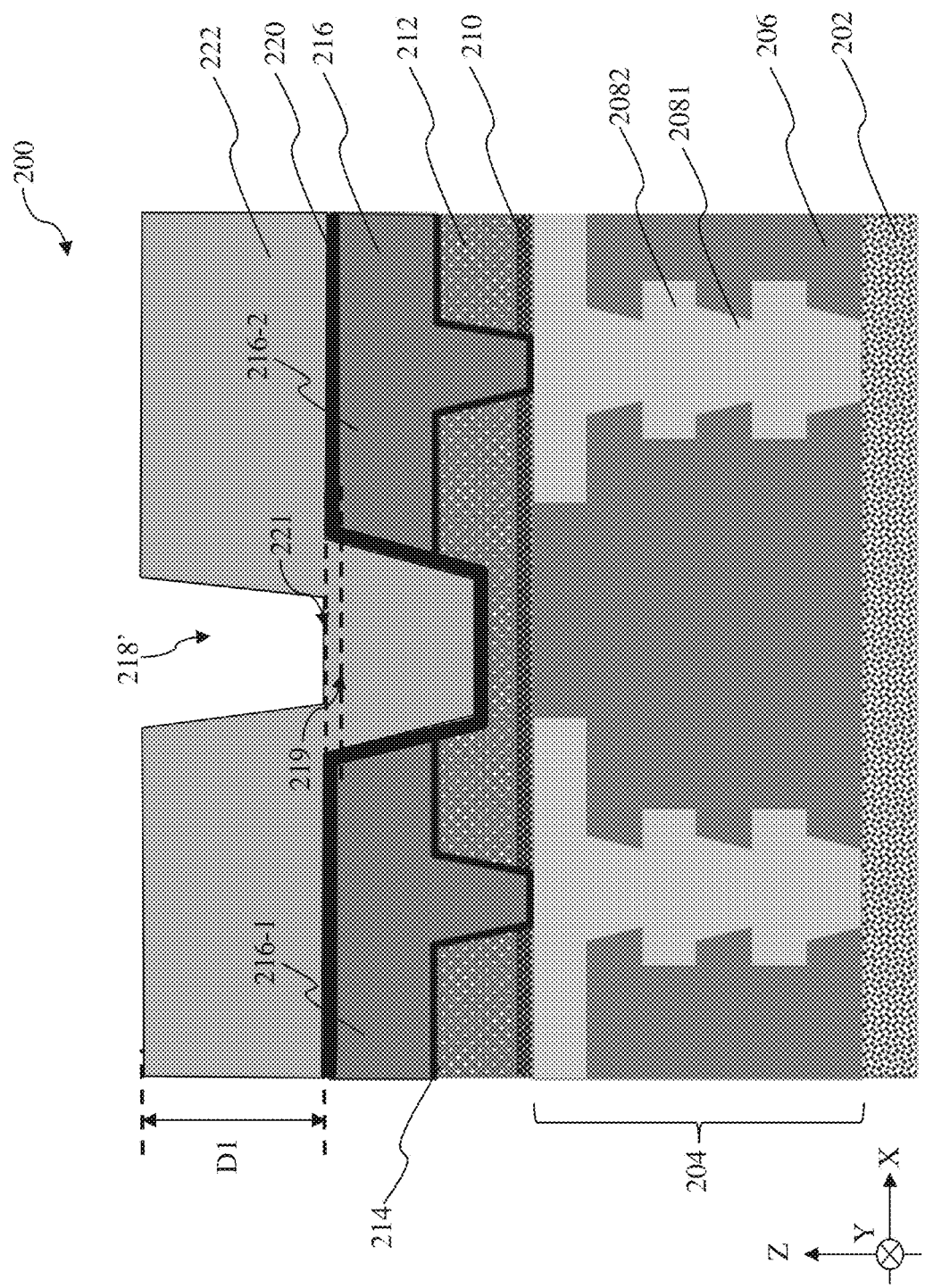

Referring now to FIGS. 1 and 4, the method 100 optionally includes a block 106 where a first dielectric layer 220 is deposited over the patterned RDL 216 that includes the first conductive feature 216-1 and the second conductive feature 216-2. Block 106 is optional because the first dielectric layer 220 functions to reduce the depth of overlying dielectric layer (such as the second dielectric layer 222, described below) that is formed using a slower deposition method. In semiconductor fabrication, a slower process at a fabrication station may translate into longer takt time and smaller throughput, which necessarily lead to high per-unit cost. That is, operations at block 106 are performed if cost is the predominant concern; and operations at block 106 are omitted if cost concerns pale in comparison to quality concerns. In some embodiments, the first dielectric layer 220 includes silicon oxide and may be formed using chemical vapor deposition (CVD), sub-atmospheric CVD (SACVD), or plasmas enhanced CVD (PECVD). In some implementations, the first dielectric layer 220 may be an undoped silicate glass (USG) layer formed to a thickness between about 1500 Angstrom (Å) and about 2500 Å, including around 2000 Å.

Referring now to FIGS. 1 and 4, the method 100 includes a block 108 where a second dielectric layer 222 is deposited over the first dielectric layer 220. The second dielectric layer 222 is deposited using a deposition technique different from the one used to deposit the first dielectric layer 220. In some embodiments, the second dielectric layer 222 includes silicon oxide and may be deposited using high density plasma chemical vapor deposition (HDPCVD) to a thickness D1 between about 1700 nm and about 2100 nm. Compared to the first dielectric layer 220 deposited PECVD and SACVD, which includes straight-up deposition, HDPCVD includes alternating deposition and etching-back cycles to prevent accumulation around edges so as to provide good step coverage. Therefore, the rate of formation of the second dielectric layer 222 using HDPCVD is much slower than the rate of formation of the first dielectric layer 220 formed of USG. When operations of the optional block 106 are omitted, the thickness of the would-be first dielectric layer 220 is replaced with the second dielectric layer 222 formed using the slower HDPCVD, resulting in increase of process time. When operations of the optional block 106 are performed, the thickness of the first dielectric layer 220 reduces the thickness of the second dielectric layer 222 that otherwise would be needed without the first dielectric layer 220.

It is noted that while the first dielectric layer 220 and the second dielectric layer 222 partially fill the recess 218, a dent 218' remains. In some embodiments, the second dielectric layer 222 is deposited to the thickness D1 to ensure a bottom surface 221 of the dent 218' is higher (farther away from the substrate 202) than a top surface 219 of the RDL 216. When the bottom surface 221 is higher (farther away from the substrate 202) than the top surface 219, the first conductive feature 216-1 and the second conductive feature 216-2 are spaced apart by portions of the first dielectric layer 220 and the second dielectric layer 222, and the third dielectric layer 224 (shown in FIG. 5) does not extend between the first conductive feature 216-1 and the second conductive feature 216-2. That means the first conductive feature 216-1 and the second conductive feature 216-2 are separated largely by the second dielectric layer 222, which may include silicon oxide deposited using HDPCVD.

Figure 5:
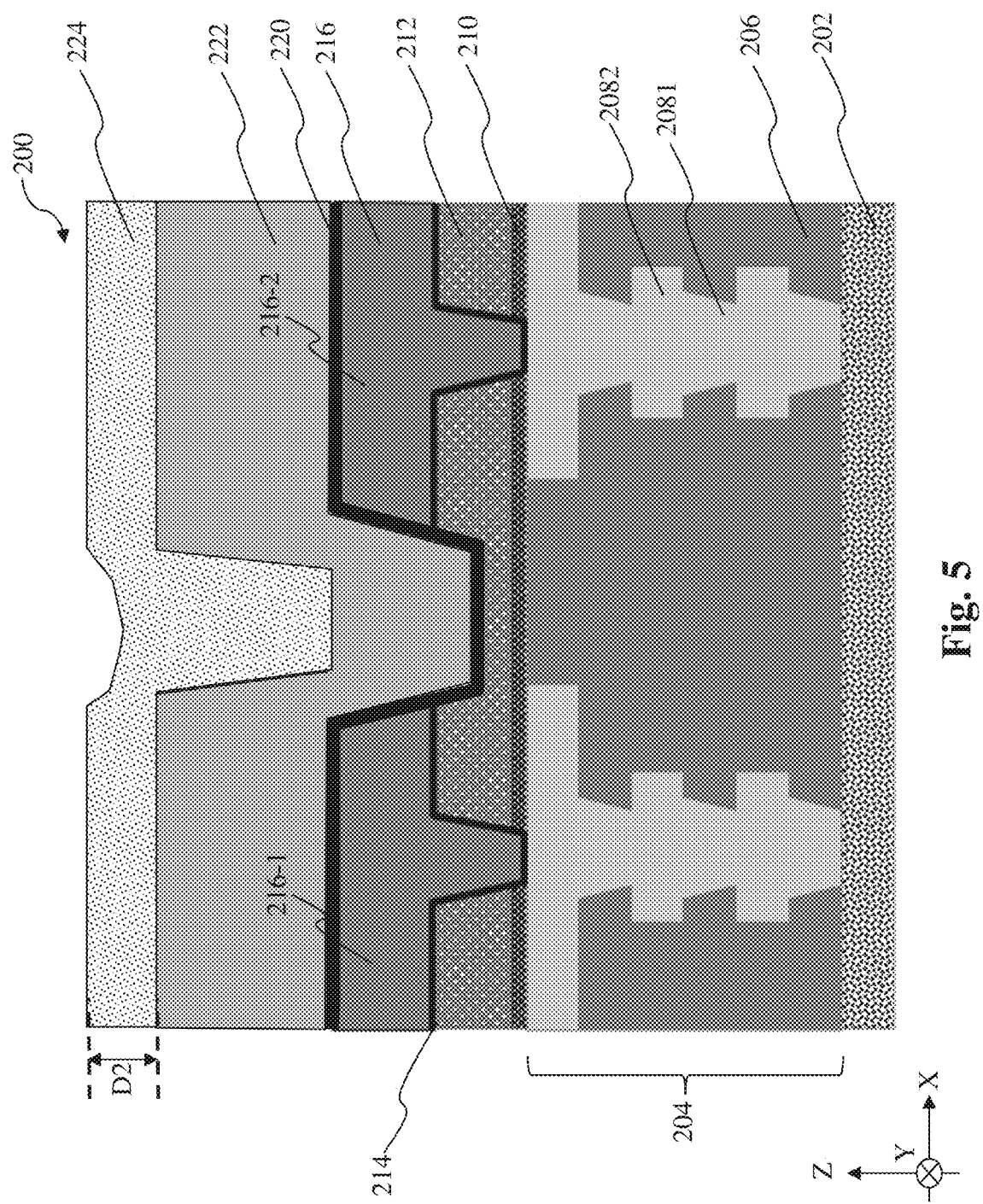

Referring now to FIGS. 1 and 5, the method 100 includes a block 110 where a third dielectric layer 224 is deposited over the second dielectric layer 222. The third dielectric layer 224 is deposited using a deposition technique different from the one used to deposit the second dielectric layer 222. In some embodiments, the third dielectric layer 224 includes silicon oxide and may be deposited using CVD, SACVD. In some implementations, the third dielectric layer 224 may be an undoped silicate glass (USG) layer formed to a thickness D2 between about 6000 Angstrom (Å) and about 10000 Å. The thickness D2 is selected such that a lowest top surface of the third dielectric layer 224 is higher (farther away from the substrate 202) than a top surface of the second dielectric layer 222. This arrangement helps ensure that after the planarization process at block 112 (described below), the workpiece 200 would include a level top surface.

The first dielectric layer 220 and the third dielectric layer 224 formed using USG oxide have different properties than the second dielectric layer 222 formed using HDPCVD. It has been observed that USG silicon oxide that forms the first dielectric layer 220 and the third dielectric layer 224 has different properties than HDPCVD silicon oxide that forms the second dielectric layer 222. For example, USG silicon oxide is denser than HDPCVD silicon oxide. In some instances, USG silicon oxide has a density between about 1.97 g/cm3 and about 2.17 g/cm3 while HDPCVD silicon oxide has a density between about 2.26 g/cm3 and about 2.46 g/cm3. For another example, an HDPCVD silicon oxide has better step coverage than a USG silicon oxide. That is, when used to fill a trench or opening, there is less chance to find voids or cavities in HDP silicon oxide than in USG silicon oxide. It has been observed that when an aspect ratio (height/width) of a trench/opening is smaller than about 1.1~1.3, the trench/opening may be substantially filled by USG silicon oxide without voids or cavities. However, when an aspect ratio (height/width) of a trench/opening is equal to or greater than about 1.1~1.3, voids and cavities are likely to form in the opening and trench. Based on the foregoing, the first dielectric layer 220 and the third dielectric layer 224 is less dense than the second dielectric layer 222. When the first dielectric layer 220 is formed, the aspect ratio of the recess 118 is still less than about 1.1~1.3 and the first dielectric layer 220 is free of voids and cavities. When the dent 118' has an aspect ratio greater than about 1.1~1.3, the third dielectric layer 224 may have voids and cavities. When the dent 118' has an aspect ratio smaller than about 1.1~1.3, the third dielectric layer 224 may be free of voids and cavities, just like the second dielectric layer 222.

Figure 6:
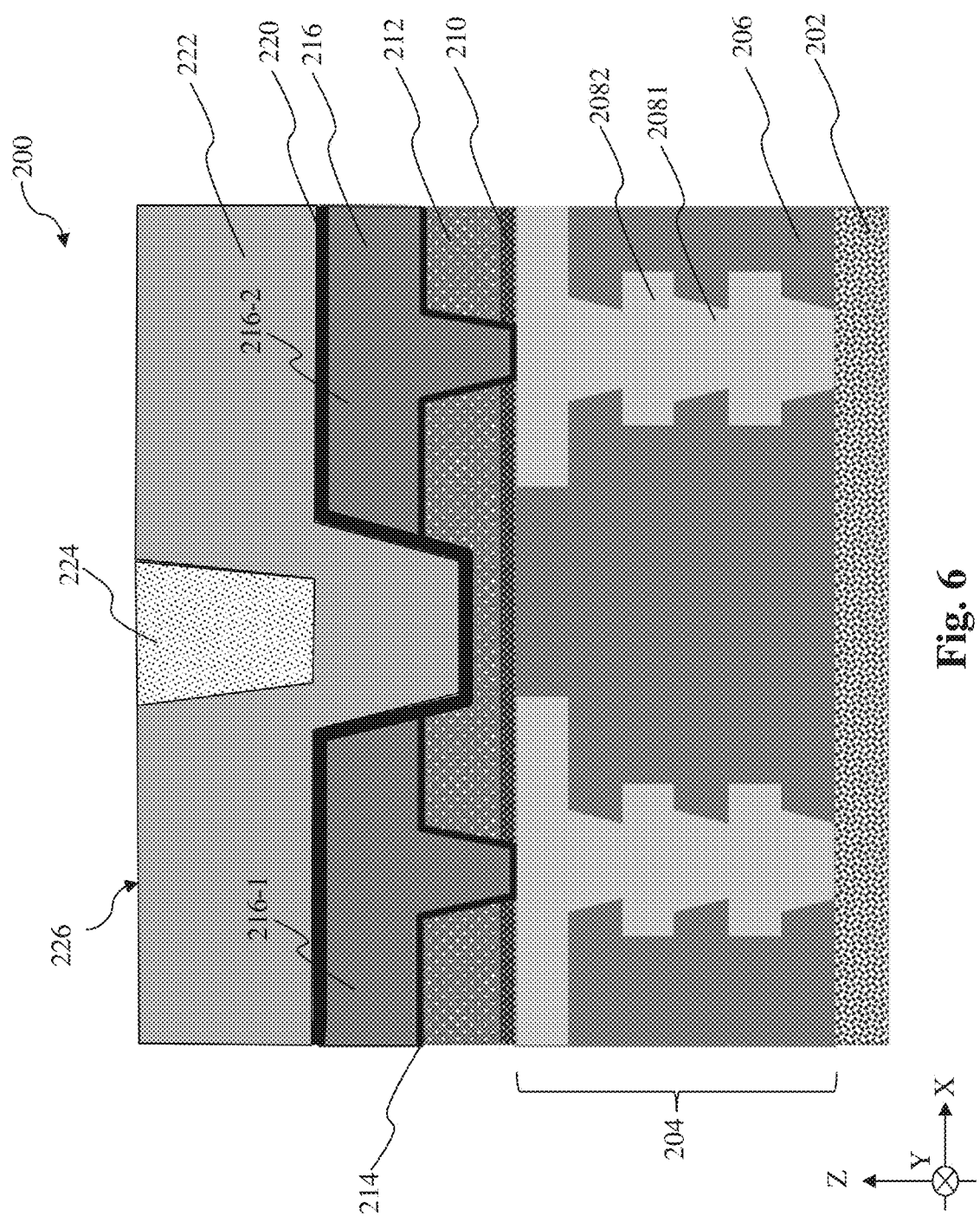

Referring now to FIGS. 1 and 6, the method 100 includes a block 112 where a top surface of the workpiece 200 is planarized to provide a level top surface 226. In some embodiments, the workpiece 200 is planarized using CMP. Portions of the third dielectric layer 224 and the second dielectric layer 222 are removed at block 112 to produce the level top surface 226. As illustrated in FIG. 6, the level top surface 226 includes a portion of the third dielectric layer 224 and a portion of the second dielectric layer 222.

Figure 7:
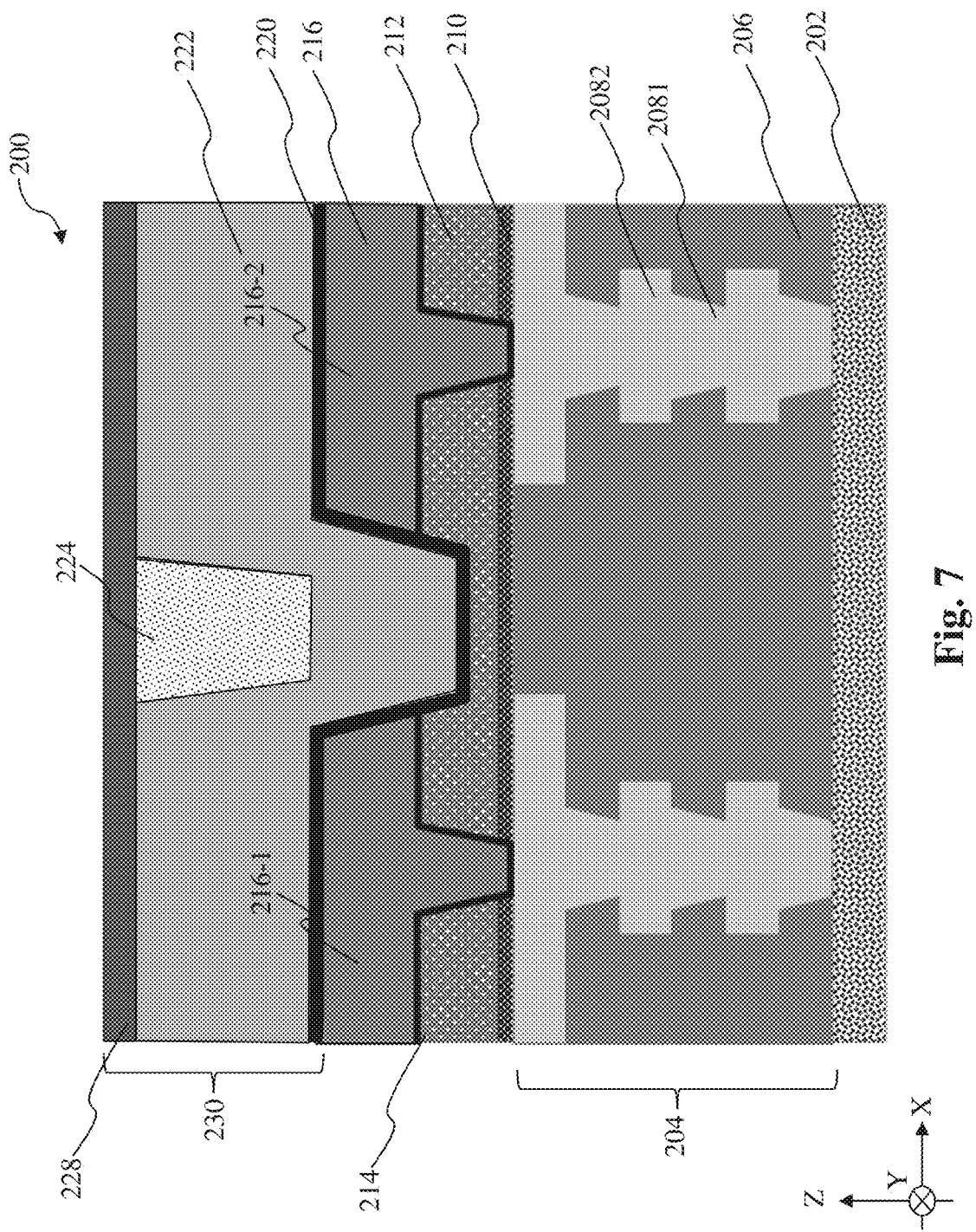

Referring to FIGS. 1 and 7, the method 100 includes a block 114 where a fourth dielectric layer 228 is deposited over the level top surface 226. In some embodiments, the fourth dielectric layer 228 may be of a nitrogen-containing dielectric material such as silicon nitride or silicon carbonitride and may be deposited using CVD, PECVD, HDPCVD, SACVD, or a suitable deposition technique. In one embodiment, the fourth dielectric layer 228 is formed of silicon nitride. Because the fourth dielectric layer 228 is deposited over and in direct contact with the level top surface 226, the fourth dielectric layer 228 is planar and does not extend downward (towards the substrate 202) into either the third dielectric layer 224 or the second dielectric layer 222. In some implementations, the fourth dielectric layer 228 is formed to a thickness between about 4000 Å and about 10000 Å, including about 7000 Å.

The first dielectric layer 220, the planarized second dielectric layer 222, the planarized third dielectric layer 224, and the fourth dielectric layer 228 may be regarded as a second passivation layer 230. As illustrated in FIG. 7, the RDL 216, such as the first conductive feature 216-1 and the second conductive feature 216-2, is sandwiched between the underlying first passivation layer 212 and the overlying second passivation layer 230. The multi-layer structure of the second passivation layer shields cracks from reaching to the underlying structures, such as the RDL 216. The first dielectric layer 220 (if formed), the second dielectric layer 222 and the third dielectric layer 224, which are formed using USG silicon oxide or HDPCVD oxide, have a Young's modulus between about 62 GPa and about 76 GPa. The fourth dielectric layer 228, which is formed of a nitrogen-containing dielectric material such as silicon nitride or silicon carbonitride, has a Young's Modulus of about 310 GPa. Due to their lower Young's Modulus, the first dielectric layer 220, the second dielectric layer 222, and the third dielectric layer 224 are less brittle than the fourth dielectric layer 228. Therefore, the bottom three dielectric layers of the second passivation layer 230 are more resistant to stress. In the event one or more cracks do occur either during fabrication or during use, the cracks are likely to penetrate through the fourth dielectric layer 228 because bottom three dielectric layers can act like a sponge to absorb the stress and therefore effectively prevent the cracks from spreading or penetrating further. Forming the fourth dielectric layer 228 as a planar layer over the level top surface 226 further prevents stress from be concentrated at corners, which may help propagate cracks through the sponge-like bottom three dielectric layers of the second passivation layer 230.

Figure 8:
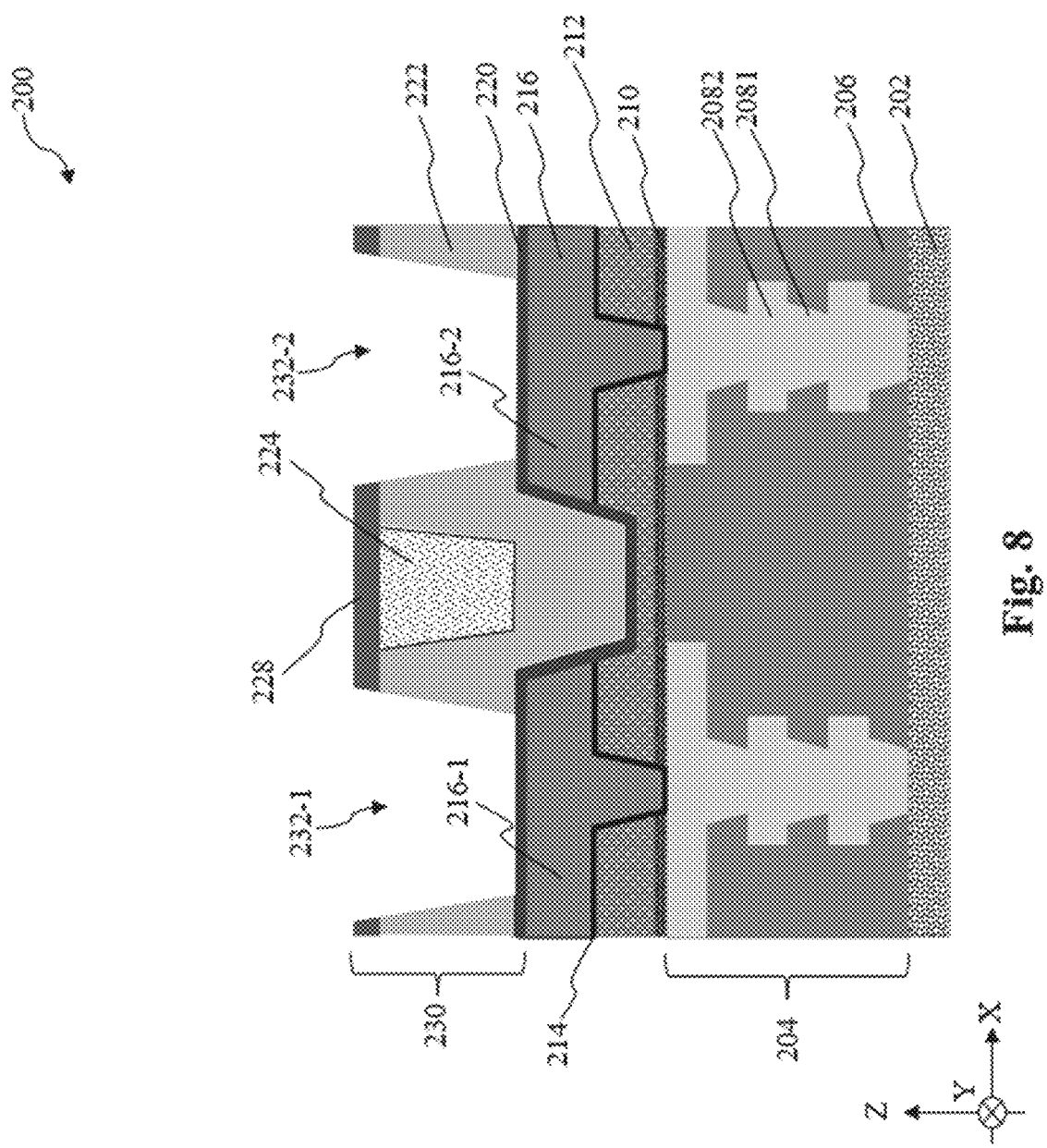

Referring to FIGS. 1 and 8, the method 100 includes a block 116 where a first contact recess 232-1 and a second contact recess 232-2 are formed to expose the first conductive feature 216-1 and the second conductive feature 216-2, respectively. In some embodiments, the first conductive feature 216-1 and the second conductive feature 216-2 may serve as contact pads to engage contact features to be formed in the first contact recess 232-1 and the second contact recess 232-2. The first contact recess 232-1, the second contact recess 232-2, and other contact recesses not shown in FIG. 8 may be collectively referred to as contact recesses 232.

Figure 9:
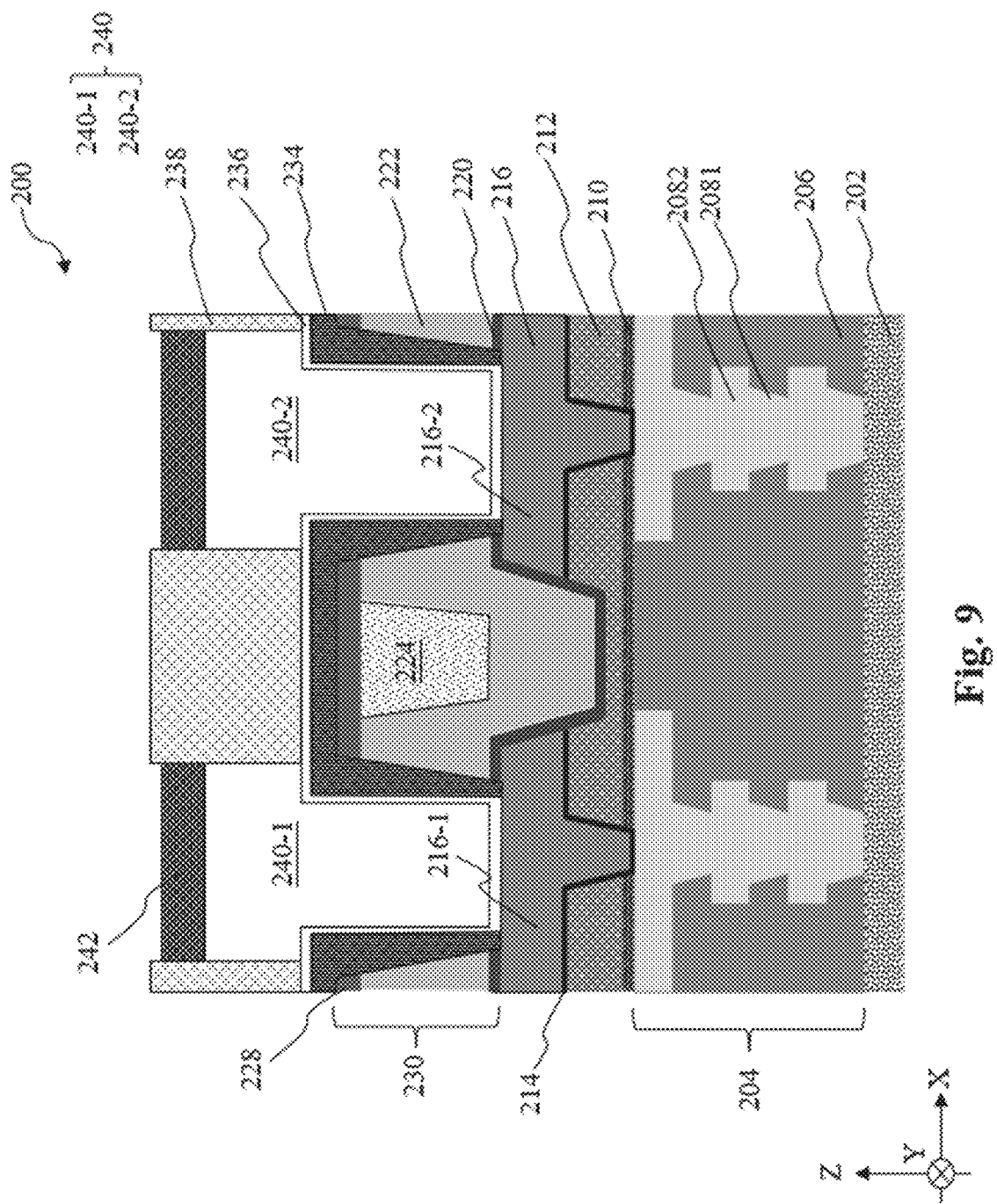

Referring to FIGS. 1 and 9, the method 100 includes a block 118 where contact features 240 are formed in the contact recesses 232. Contact features 240 include at least a first contact feature 240-1 and a second contact feature 240-2 shown in FIG. 9. In some embodiments, a protection layer 234 is formed over the workpiece 200, including over sidewalls of the first contact recess 232-1 and the second contact recess 232-2, the first conductive feature 216-1, the second conductive feature 216-2. In some embodiments, the protection layer 234 may be formed of a photoresist material, a polymeric material, polybenzoxazole (PBO), polyimide, benzocyclobutene (BCB), or the like. In some instances, the protection layer 234 is cured by baking or exposure to ultraviolet (UV) light radiation. In those instances, the volume of the protection layer 234 may shrink as result of solvent evaporation or reduction reaction. That shrinkage of volume may exert compression stress on the second passivation layer 230. In embodiments of the present disclosure, the fourth dielectric layer 228 has a top surface that prevents any thermal stress from being concentrated at corners or uneven surfaces of the fourth dielectric layer 228.

In some implementations, the protection layer 234 is patterned to expose the first conductive feature 216-1 and the second conductive feature 216-2. Then a seed layer 236 is deposited over the workpiece 200. In some embodiments, the seed layer 236 is formed using CVD, atomic layer deposition (ALD) or metal organic CVD (MOCVD) and may include copper (Cu), tantalum (Ta), titanium (Ti), titanium nitride (TiN), tantalum nitride (TaN). In some embodiment, the seed layer 236 is a single metal layer. In some other embodiments, the seed layer 236 is a composite layer. In some implementations, a composite seed layer 236 may include a titanium layer and a copper layer over the titanium layer. A mask layer 238 that exposes the first conductive feature 216-1 and the second conductive feature 216-2 is then formed over the workpiece 200. In some instances, the mask layer 238 may be a photoresist patterned using photolithography techniques.

Figure 10:
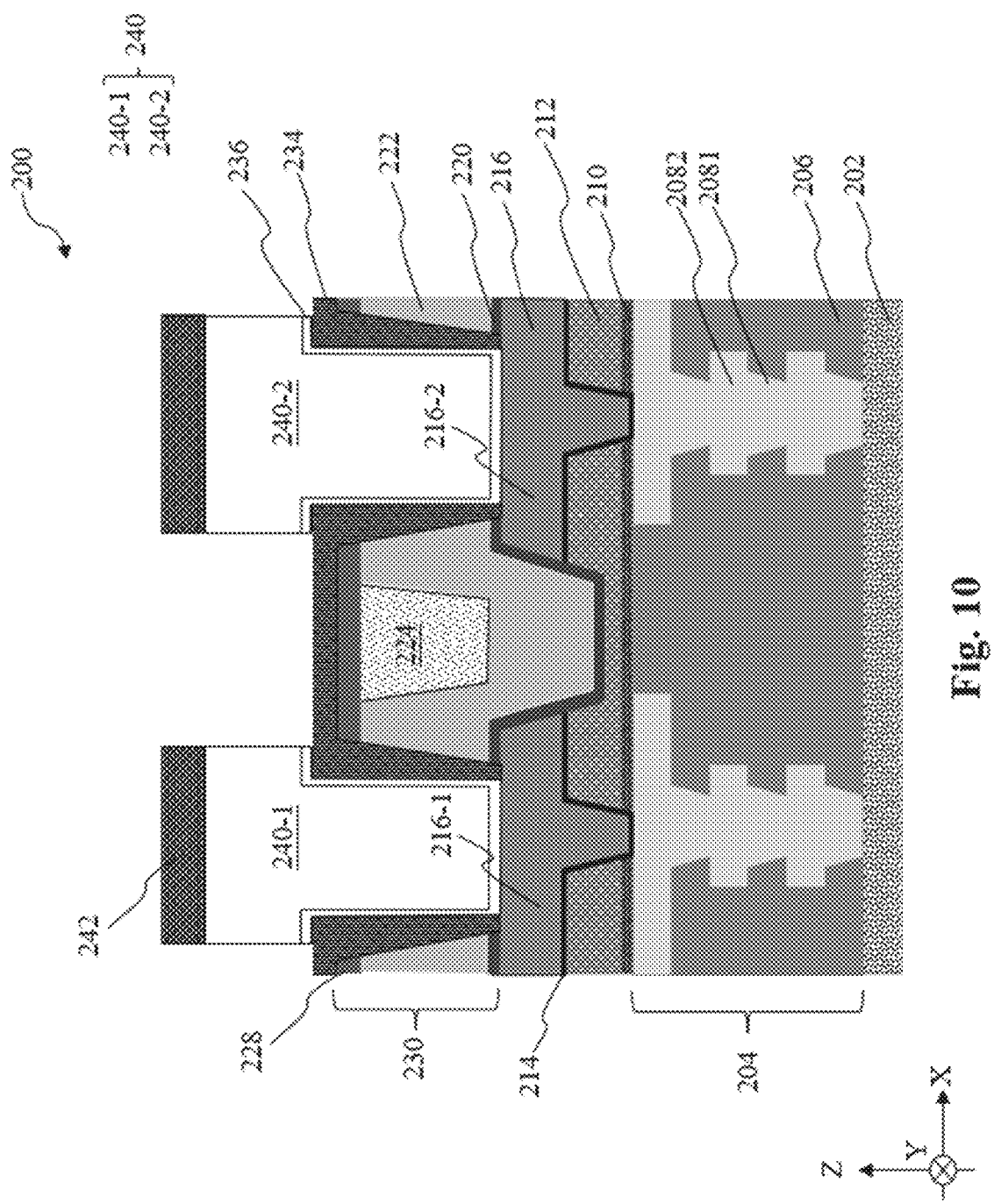

Contact features 240 are then deposited on areas not covered by the mask layer 238 by electroplating or electroless plating. The contact features 240 may be formed of copper, nickel, cobalt, aluminum, gold, silver, palladium, tin, bismuth, or an alloy thereof. In some embodiments, the contact features 240 take a form a pillar as shown in FIG. 9 and may therefore be referred to as conductive pillars 240. In some of those embodiments where in the conductive pillars 240 includes copper, the conductive pillars 240 may be referred to as copper pillars 240. In embodiments represented in FIG. 9, a solder layer 242 is then deposited over the contact features 240. Portions of the solder layer 242 deposited on the first contact feature 240-1 and the second contact feature 240-2 may be referred to as solder features. The solder layer 242 may be formed of lead-based and lead-free solders, such as Pb—Sn compositions for lead-based solder, lead-free solders including InSb, tin, silver, and copper ("SAC") compositions, and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free conductive materials such as solder balls may be formed from SnCu compounds as well, without the use of silver (Ag). Lead-free solder may also include tin and silver, Sn—Ag, without the use of copper. After the deposition of the solder layer 242, the mask layer 238 as well as the portion of the seed layer 236 not covered by the contact features 240 are removed by one or more etching processes, as illustrated in FIG. 10.

Figure 11:
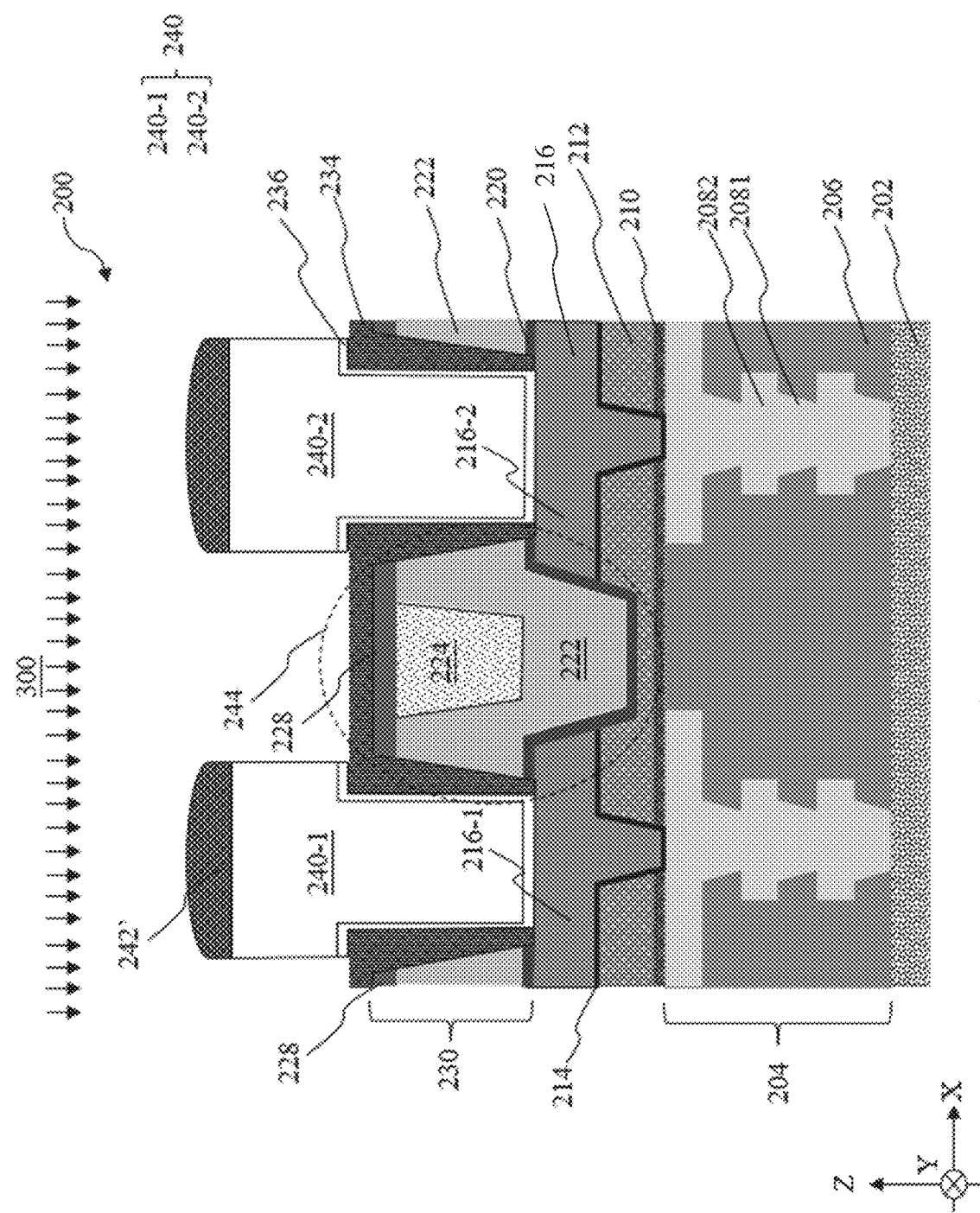

Referring now to FIGS. 1 and 11, the method 100 includes a block 120 where the contact features 240 and the solder layer 242 are annealed in an anneal process 300. At block 120, the solder layer 242 is annealed by the anneal process 300 to reflow over the contact features 240 to form a desired bump shape. The reflowed solder layer 242' serves as a point of connection to external circuitry, such as another substrate, a printed circuit board (PCB), an interposer, a reconstituted wafer, an IC die, another redistribution layer, other interconnect structure, or other semiconductor device. The anneal process 300 at block 120 may again generate stress due to mismatch of CTEs of the polymeric protection layer 234 and the second passivation layer 230. The planar fourth dielectric layer 228 disposed over the level top surface 226 of the second dielectric layer 222 and the third dielectric layer 224 may function to reduce concentration of such thermally induced stress.

As shown in FIG. 11, when viewed along the Y direction, the first contact feature 240-1 and the second contact feature 240-2 are spaced apart by a passivation feature 244, which is formed from the second passivation layer 230 and the protection layer 234. The passivation feature 244 includes a bottom portion and a top portion. The bottom portion of the passivation feature 244 extends between the first conductive feature 216-1 and the second conductive feature 216-2 and includes a portion of the first dielectric layer 220 (if formed) and a portion of the second dielectric layer 222. When the first dielectric layer 220 is omitted, the bottom portion of the passivation feature 244 is formed of the portion of the second dielectric layer 222 that extends between the first conductive feature 216-1 and the second conductive feature 216-2. The top portion of the passivation feature 244 is disposed between the first contact feature 240-1 and the second contact feature 240-2 but does not extend between the first conductive feature 216-1 and the second conductive feature 216-2. As illustrated in FIG. 11, the top portion of the passivation feature 244 includes a portion of the second dielectric layer 222 and a portion of the third dielectric layer 224 that extends into the second dielectric layer 222. The portion of the second dielectric layer 222 and the portion of the third dielectric layer 22 share the level top surface 226 (shown in FIG. 6) on which the fourth dielectric layer 228 is formed. Due to the formation of the first contact recess 232-1 and the second contact recess 232-2, the portion of the second dielectric layer 222 in the passivation feature 244 have tapered sidewalls that lead downward to a wider bottom dimension along the X direction. The top portion of the passivation feature 244 is wrapped around by the protection layer 234. It is noted that due to the planar shape of the fourth dielectric layer 228, no part of the protection layer 234 extends into the fourth dielectric layer 228 along the Z direction. The passivation feature 224 may be view as including a silicon oxide feature (including portions of the first dielectric layer 220, the second dielectric layer 222 and the third dielectric layer 224 between the first conductive feature 216-1 and the second conductive feature 216-2, as well as between the first contact feature 240-1 and the second contact feature 240-2) and a nitrogen-containing dielectric layer (the portion of the fourth dielectric layer 228 between the first contact feature 240-1 and the second contact feature 240-2) disposed on the level top surface of the silicon oxide feature.

Embodiments of the present disclosure provide benefits. In some embodiments, a semiconductor device includes a passivation structure that has a plurality of oxide layers and a planar nitride layer over the plurality of oxide layers. After the last oxide layer of the plurality of oxide layers is deposited, a planarization process, such as a chemical mechanical polishing (CMP) process is performed to provide a level top surface free of any recesses, dents, and lower regions. The planar nitride layer is then deposited on the level top surface. As a result, no portion of the planar nitride layer extends into any portion of the plurality of oxide layers. The planar nitride layer includes no corners or corner structures where thermal cracks may develop, thus reducing defect occurrence and improving process yield.

One aspect of the present disclosure involves a semiconductor device. The semiconductor device includes a redistribution layer including a first conductive feature and a second conductive feature, a first contact feature disposed over and electrically coupled to the first conductive feature, a second contact feature disposed over and electrically coupled to the second conductive feature, and a passivation feature extending from between the first conductive feature and the second conductive feature to between the first contact feature and the second contact feature. The passivation feature includes a dielectric feature including a planar top surface extending from a first end of the passivation feature adjacent the first contact feature to a second end of the passivation feature adjacent the second contact feature, and a dielectric layer disposed on the planar top surface of the dielectric feature. A composition of the dielectric feature is different from a composition of the dielectric layer.

In some embodiments, the dielectric feature consists essentially of silicon oxide. In some embodiments, the dielectric layer consists essentially of silicon nitride. In some implementations, the dielectric layer does not extend into the dielectric feature. In some embodiments, the first conductive feature and the second conductive feature include an alloy of copper and aluminum. In some instances, the semiconductor device further includes a polymeric layer wrapped around the passivation feature and the polymeric layer does not extend into the dielectric layer.

One aspect of the present disclosure involves a method. The method includes receiving an integrated circuit (IC) workpiece including a redistribution layer disposed over and electrically coupled to an interconnect structure, patterning the redistribution layer to form a recess between and separating a first conductive feature and a second conductive feature of the redistribution layer, depositing a first dielectric layer over the redistribution layer and the recess using a first deposition technique, depositing a second dielectric layer over the first dielectric layer using a second deposition technique different from the first deposition technique, depositing a third dielectric layer over the second dielectric layer using a third deposition technique different from the second deposition technique, planarizing the second dielectric layer and the third dielectric layer to provide a level surface, and depositing a fourth dielectric layer over the level surface. A composition of the fourth dielectric layer is different from a composition of first dielectric layer, the second dielectric layer, or the third dielectric layer.

In some embodiments, the first deposition technique is chemical vapor deposition (CVD). In some embodiments, the second deposition technique is high density plasma chemical vapor deposition (HDPCVD). In some implementations, the third deposition technique is chemical vapor deposition (CVD). In some embodiments, the first dielectric layer, the second dielectric layer, and the third dielectric layer include silicon oxide and the fourth dielectric layer includes silicon nitride. In some embodiments, the depositing of the second dielectric layer is such that a lowest top surface of the second dielectric layer is positioned higher than a top surface of the redistribution layer along a direction perpendicular to the IC workpiece. In some instances, the method further includes forming a first contact recess to expose a portion of the first conductive feature, forming a second contact recess to expose a portion of the second conductive feature, and forming a polymeric protection layer over the IC workpiece. The fourth dielectric layer includes a planar top surface and the polymeric protection layer does not extend into the fourth dielectric layer. In some embodiments, the depositing of the first dielectric layer includes conformally depositing the first dielectric layer to a first thickness between 1000 (Angstrom) Å and 2000 Å. The depositing of the second dielectric layer over the first dielectric layer includes depositing the second dielectric layer to a second thickness between about 1,700 nm and about 2,100 nm. The depositing of the third dielectric layer over the second dielectric layer includes depositing the third dielectric layer to a third thickness between about 600 nm and 1000 nm.

Another aspect of the present disclosure involves a method. The method includes receiving an integrated circuit (IC) workpiece including a redistribution layer disposed over and electrically coupled to an interconnect structure, patterning the redistribution layer to form a recess between and separating a first conductive feature and a second conductive feature of the redistribution layer, depositing a first oxide layer over the redistribution layer and the recess using high density plasma chemical vapor deposition (HDPCVD), depositing a second oxide layer over the first oxide layer, planarizing the first oxide layer and the second oxide layer to provide a level top surface, and depositing a nitride layer over the level top surface.

In some embodiments, the depositing of the second oxide layer is such that the second oxide layer does not extend between the first conductive feature and the second conductive feature. In some embodiments, the depositing of the first oxide layer over the redistribution layer and the recess includes depositing the first oxide layer to a first thickness between about 1,700 nm and about 2,100 nm. The depositing of the second oxide layer over the first oxide layer includes depositing the second oxide layer to a second thickness between about 600 nm and 1000 nm. In some instances, the depositing of the nitride layer over the level top surface includes depositing the nitride layer to a third thickness between about 600 nm and about 800 nm. In some implementations, the method further includes forming a first contact recess to expose a portion of the first conductive feature, forming a second contact recess to expose a portion of the second conductive feature, and forming a polymeric protection layer over the IC workpiece. The nitride layer includes a planar top surface and the polymeric protection layer does not extend into the nitride layer. In some instances, the method further includes forming a first contact feature and a second contact feature in the first contact recess and the second contact recess, respectively, forming a first solder feature and a second solder feature on the first contact feature and second contact feature, respectively, and annealing the IC workpiece to reflow the first solder feature and the second solder feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a redistribution layer comprising:
a passivation layer, and
a first conductive feature and a second conductive feature disposed in the passivation layer;
a first contact feature disposed over and electrically coupled to the first conductive feature;
a second contact feature disposed over and electrically coupled to the second conductive feature; and
a passivation feature extending from between the first conductive feature and the second conductive feature to between the first contact feature and the second contact feature, the passivation feature comprising:
a dielectric feature including a planar top surface extending from a first end of the passivation feature adjacent the first contact feature to a second end of the passivation feature adjacent the second contact feature, and
a dielectric layer disposed on the planar top surface of the dielectric feature,
wherein a composition of the dielectric feature is different from a composition of the dielectric layer,
wherein the passivation feature partially extends into the passivation layer.

2. The semiconductor device of claim 1, wherein the dielectric feature consists essentially of silicon oxide.

3. The semiconductor device of claim 1, wherein the dielectric layer consists essentially of silicon nitride.

4. The semiconductor device of claim 1, wherein the dielectric layer does not extend into the dielectric feature.

5. The semiconductor device of claim 1, wherein the first conductive feature and the second conductive feature comprise an alloy of copper and aluminum.

6. The semiconductor device of claim 1, further comprising a polymeric layer wrapped around the passivation feature, wherein the polymeric layer does not extend into the dielectric layer.

7. The semiconductor device of claim 6, wherein the dielectric feature is spaced apart from the first contact feature and the second contact feature by the polymeric layer.

8. A semiconductor structure, comprising:
a first conductive feature and a second conductive feature over a passivation layer;
a first contact feature disposed over and electrically coupled to the first conductive feature;
a second contact feature disposed over and electrically coupled to the second conductive feature;
a dielectric feature comprising:
a bottom portion disposed between the first conductive feature and the second conductive feature,
a top portion disposed over the bottom portion and between the first contact feature and the second contact feature, and
a planar top surface; and
a dielectric layer disposed over the planar top surface,
wherein the bottom portion of the dielectric feature extends into the passivation layer.

9. The semiconductor structure of claim 8, wherein a portion of the dielectric feature is disposed directly over the first conductive feature.

10. The semiconductor structure of claim 8, wherein the passivation layer comprises silicon carbon nitride (SiCN), silicon oxycarbide (SiOCN), silicon oxycarbide (SiOC), silicon carbide (SiC), or silicon nitride (SiN),
wherein the dielectric feature comprises silicon oxide,
wherein the dielectric layer comprises silicon nitride.

11. The semiconductor structure of claim 8, further comprising a protection layer in contact with sidewalls of the top portion of the dielectric feature and a top surface of the dielectric layer.

12. The semiconductor structure of claim 11, wherein the protection layer is spaced apart from the planar top surface of the dielectric feature by the dielectric layer.

13. The semiconductor structure of claim 11, wherein the protection layer comprises a polybenzoxazole (PBO), polyimide, or benzocyclobutene (BCB).

14. The semiconductor structure of claim 11, wherein the dielectric feature is spaced apart from the first contact feature and the second contact feature by the protection layer.

15. The semiconductor structure of claim 11, further comprising:
a seed layer disposed between the first conductive feature and the first contact feature,
wherein the first contact feature comprises copper, nickel, cobalt, aluminum, gold, silver, palladium, tin, bismuth, or an alloy thereof,
wherein the seed layer comprises copper, tantalum, titanium, titanium nitride, or tantalum nitride.

16. The semiconductor structure of claim 15, wherein the seed layer is in contact with the protection layer.

17. A semiconductor structure, comprising:
a first conductive feature and a second conductive feature;
a protection layer over the first conductive feature and the second conductive feature;
a first contact feature extending through the protection layer to electrically couple to the first conductive feature;
a second contact feature extending through the protection layer to electrically couple to the second conductive feature;
a dielectric feature comprising:
 a bottom portion disposed between the first conductive feature and the second conductive feature,
 a top portion disposed in the protection layer and between the first contact feature and the second contact feature, and
 a planar top surface; and
a dielectric layer disposed over the planar top surface of the dielectric feature.

18. The semiconductor structure of claim 17, wherein the dielectric layer is covered by the protection layer.

19. The semiconductor structure of claim 17, where the dielectric feature comprises:
a bottom layer in contact with the first conductive feature and the second conductive feature;
a middle layer over the bottom layer and in contact with the protection layer and the dielectric layer; and
a top layer over the middle layer and in contact with the dielectric layer.

20. The semiconductor structure of claim 19, wherein the top layer is spaced apart from the protection layer by the middle layer.

* * * * *